United States Patent
Suguro

(10) Patent No.: US 9,478,412 B2
(45) Date of Patent: Oct. 25, 2016

(54) SEMICONDUCTOR MANUFACTURING APPARATUS AND METHOD OF MANUFACTURING SEMICONDUCTOR DEVICE

(71) Applicant: KABUSHIKI KAISHA TOSHIBA, Tokyo (JP)

(72) Inventor: Kyoichi Suguro, Ishikawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 14/624,829

(22) Filed: Feb. 18, 2015

(65) Prior Publication Data
US 2016/0042944 A1 Feb. 11, 2016

(30) Foreign Application Priority Data

Aug. 5, 2014 (JP) ................................. 2014-159637

(51) Int. Cl.
*H01L 21/02* (2006.01)
*H01J 37/32* (2006.01)

(52) U.S. Cl.
CPC ... *H01L 21/02233* (2013.01); *H01J 37/32192* (2013.01); *H01J 37/32733* (2013.01); *H01J 37/32935* (2013.01); *H01J 2237/202* (2013.01); *H01J 2237/338* (2013.01)

(58) Field of Classification Search
CPC ............................ H01L 21/02233; G03F 7/36
USPC ........................... 438/782; 118/723 MW, 723
See application file for complete search history.

(56) References Cited

U.S. PATENT DOCUMENTS

| | | | | |
|---|---|---|---|---|
| 4,434,742 A | * | 3/1984 | Henaff | B01J 19/08 118/50.1 |
| 6,397,776 B1 | * | 6/2002 | Yang | C23C 16/401 118/719 |
| 6,676,761 B2 | * | 1/2004 | Shang | H01L 21/68742 118/715 |
| 2002/0173126 A1 | * | 11/2002 | Nickles | H01L 21/3105 438/502 |
| 2003/0045098 A1 | * | 3/2003 | Verhaverbeke | H01L 21/67069 438/689 |
| 2006/0033678 A1 | * | 2/2006 | Lubomirsky | C23C 16/06 345/32 |

(Continued)

FOREIGN PATENT DOCUMENTS

JP 3049932 6/2000
JP 2000-345351 12/2000

(Continued)

OTHER PUBLICATIONS

W. Lerch et al., "Scaling requires continuous innovation in thermal processing: low-temperature plasma oxidation", Abstract #873, ECS Meeting (The Electrochemical Society), 2012, 11 pages.

*Primary Examiner* — Moazzam Hossain
(74) *Attorney, Agent, or Firm* — Finnegan, Henderson, Farabow, Garrett & Dunner LLP

(57) ABSTRACT

In one embodiment, a semiconductor manufacturing apparatus includes a container configured to contain a wafer, and a supporter configured to support the wafer in the container. The apparatus further includes a plasma generator including a plasma tube, and configured to form a film on the wafer by generating plasma in the container with the plasma tube during a first period and during a second period after the first period. The apparatus further includes a controller configured to set a distance between the plasma tube and the wafer to be a first distance during the first period, and set the distance to be a second distance longer than the first distance during the second period.

12 Claims, 5 Drawing Sheets

(56) References Cited

U.S. PATENT DOCUMENTS

| | | | |
|---|---|---|---|
| 2006/0225656 A1* | 10/2006 | Horiguchi | H01J 37/32192 |
| | | | 118/723 MW |
| 2013/0093321 A1* | 4/2013 | Yoshikawa | H01J 37/32192 |
| | | | 315/39 |
| 2013/0104803 A1* | 5/2013 | Takizawa | C23C 16/5096 |
| | | | 118/723 E |
| 2014/0251541 A1* | 9/2014 | Iwao | H01J 37/32293 |
| | | | 156/345.41 |

FOREIGN PATENT DOCUMENTS

| | | | | |
|---|---|---|---|---|
| JP | | 2012-151185 | 8/2009 | |
| JP | WO 2011125524 A1 * | 10/2011 | | H01J 37/32192 |

* cited by examiner

SEMICONDUCTOR MANUFACTURING APPARATUS AND METHOD OF MANUFACTURING SEMICONDUCTOR DEVICE

CROSS REFERENCE TO RELATED APPLICATION

This application is based upon and claims the benefit of priority from the prior Japanese Patent Application No. 2014-159637, filed on Aug. 5, 2014, the entire contents of which are incorporated herein by reference.

FIELD

Embodiments described herein relate to a semiconductor manufacturing apparatus and a method of manufacturing a semiconductor device.

BACKGROUND

When a film is formed on a wafer with plasma, there is a problem of a distance between a plasma generator generating the plasma and the wafer. If the distance is too short, it causes the wafer to suffer damage due to the plasma, which may result in poor quality of the formed film. On the other hand, if the distance is too long, it causes a formation rate of the formed film to be slow, which causes the formation of the film to take a long time. Moreover, when the film is formed on the wafer with the plasma, X-rays arising from the plasma may cause defects in the wafer.

DETAILED DESCRIPTION

Embodiments will now be explained with reference to the accompanying drawings.

In one embodiment, a semiconductor manufacturing apparatus includes a container configured to contain a wafer, and a supporter configured to support the wafer in the container. The apparatus further includes a plasma generator including a plasma tube, and configured to form a film on the wafer by generating plasma in the container with the plasma tube during a first period and during a second period after the first period. The apparatus further includes a controller configured to set a distance between the plasma tube and the wafer to be a first distance during the first period, and set the distance to be a second distance longer than the first distance during the second period.

First Embodiment

Figure 1:
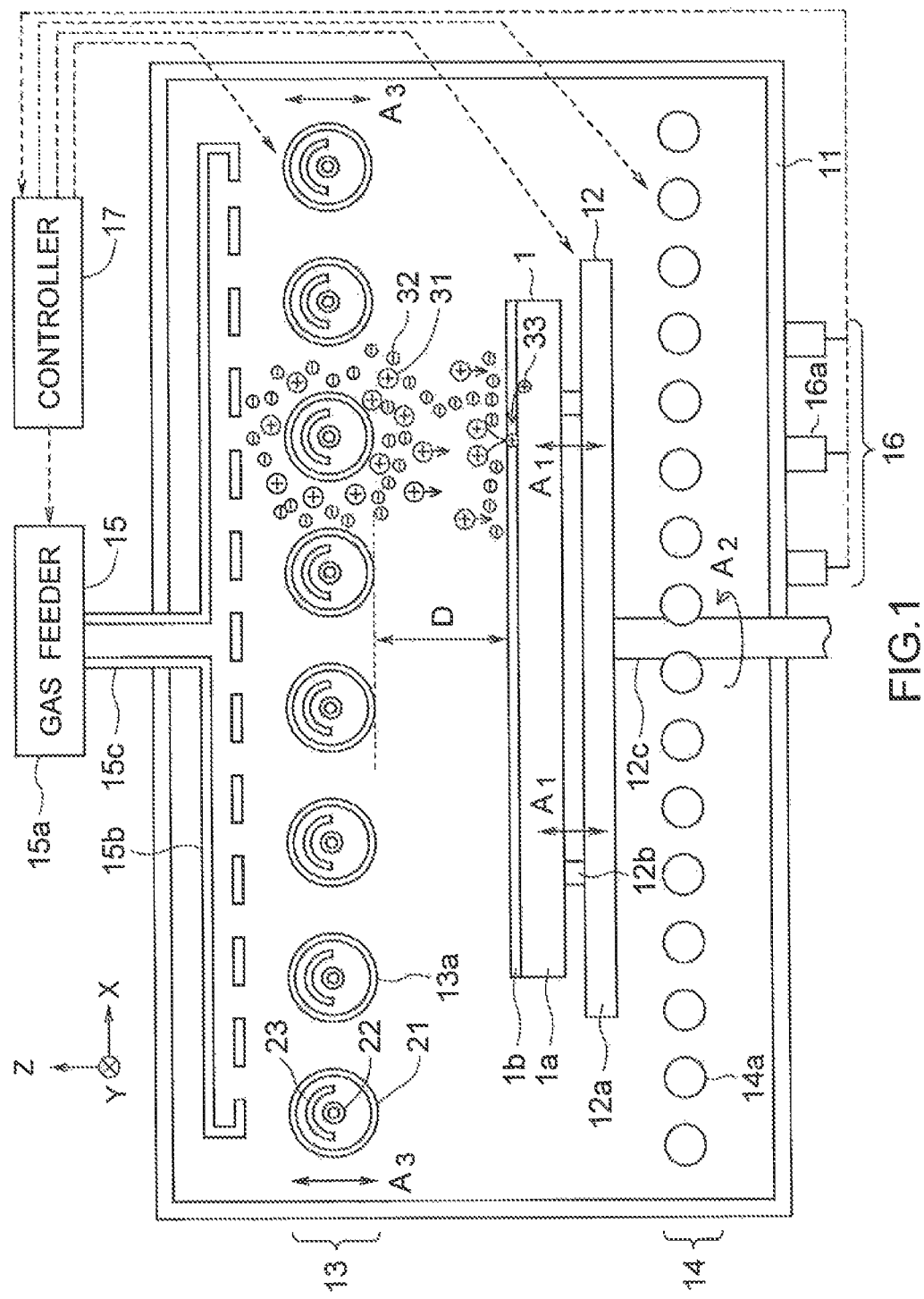
FIG. 1 is a cross-sectional view schematically illustrating a structure of a semiconductor manufacturing apparatus of a first embodiment.

FIG. 1 is a cross-sectional view schematically illustrating a structure of a semiconductor manufacturing apparatus of a first embodiment.

The semiconductor manufacturing apparatus in FIG. 1 includes a chamber 11 as an example of a container, a supporter 12, a plasma generator 13, a pre-heater 14, a gas feeding apparatus 15, a temperature measurement module 16 and a controller 17.

[Chamber 11 and Supporter 12]

The chamber 11 is used for containing a wafer 1. The supporter 12 is used for supporting the wafer 1 in the chamber 11.

The supporter 12 includes a quartz susceptor 12a, a plurality of supporting pins 12b and a rotary shaft 12c. The quartz susceptor 12a is formed of quartz which is a transparent member and disposed in the chamber 11. The supporting pins 12b protrude from a surface of the quartz susceptor 12a and are capable of elevating and lowering the wafer 1 in an upward and downward direction as indicated by an arrow $A_1$. The rotary shaft 12c is attached to a backside of the quartz susceptor 12a and is capable of rotating the wafer 1 in a horizontal plane as indicated by an arrow $A_2$.

The wafer 1 includes a semiconductor substrate 1a and an oxide film 1b formed on a surface of the semiconductor substrate 1a. An example of the semiconductor substrate 1a is a silicon substrate. An example of the oxide film 1b is a silicon oxide film. The oxide film 1b is an example of a film formed on the wafer 1. The semiconductor manufacturing apparatus of the present embodiment is used for forming the oxide film 1b on the surface of the semiconductor substrate 1a using plasma.

The semiconductor manufacturing apparatus of the present embodiment can also form a film other than the oxide film 1b on the surface of the semiconductor substrate 1a using the plasma. Examples of such a film are nitride films such as a silicon nitride film and metal films such as a metal insulation film.

In FIG. 1, there are presented an X-direction and a Y-direction which are parallel to the surface of the wafer 1 and perpendicular to each other, and a Z-direction perpendicular to the surface of the wafer 1. In the specification, the +Z-direction is regarded as an upward direction and the −Z-direction is regarded as a downward direction. For example, positional relationship between the wafer 1 and the supporter 12 is expressed as that the supporter 12 is positioned below the wafer 1. The −Z-direction in FIG. 1 may coincide with the direction of the gravity or may not coincide with the direction of the gravity.

[Plasma Generator 13]

The plasma generator 13 includes at least one plasma tube 13a which is disposed above the supporter 12. The plasma generator 13 forms the oxide film 1b on the surface of the semiconductor substrate 1a by generating the plasma in the chamber 11 using the plasma tube 13a.

The plasma generator 13 ionizes molecules constituting processing gas, and thereby, generates the plasma containing plasma ions 31 and electrons 32. An example of the processing gas is oxygen gas. An example of the plasma ion 31 is an oxygen ion. The plasma is generated in the periphery of the plasma tube 13a. While FIG. 1 illustrates the plasma generated in the periphery of one plasma tube 13a, the plasma is generated also in the periphery of the other plasma tubes 13a similarly.

When the plasma is generated in the periphery of the plasma tube 13a, first, the electrons 32 are drawn in the vicinity of the wafer 1. The reason is that the electron 32 is lighter than the plasma ion 31. After the electrons 32 are drawn in the vicinity of the wafer 1, the plasma ions 31 are also drawn in the vicinity of the wafer 1 due to electromagnetic force acting between the plasma ions 31 and the electrons 32. As a result, the plasma ions (oxygen ions) 31 react with silicon ions 33 in the semiconductor substrate 1a to form the oxide film (silicon oxide film) 1b on the surface of the semiconductor substrate 1a.

The plasma generator 13 of the present embodiment generates the plasma in the chamber 11 by generating a microwave in the plasma tube 13a. The reason for using the microwave is that the microwave is not liable to induce discharge between metal components compared with other electromagnetic waves and can efficiently form the plasma from the gas in the periphery of the plasma tube 13a.

A frequency of the microwave generated by the plasma generator 13 may be any value. It should be noted that the plasma generator 13 is desirable to generate the microwave with 2.0 GHz or more, for example, the microwave with 2.0 to 30.0 GHz in order to form the plasma efficiently from the gas in the periphery of the plasma tube 13a. For example, the frequency of the microwave is desirable to be in a 2.45 GHz band, a 5.80 GHz band or a 24.125 GHz band which are industrial, scientific and medical (ISM) bands in view of manufacturing costs and reliability of the plasma generator 13.

In the present embodiment, each plasma tube 13a has a shape extending in the Y-direction. The plasma tubes 13a are adjacent to one another in the X-direction. Distances between the plasma tubes 13a are set to be equal.

Each plasma tube 13a of the present embodiment includes a quartz tube 21, an inner electrode 22 and an outer electrode 23. The quartz tube 21 is formed of quartz which is a transparent member and has a rod shape extending in the Y-direction. A cross-sectional shape of the quartz tube 21 is annular. A length of the quartz tube 21 is set to be larger than a diameter of the wafer 1. The inside of the quartz tube 21 is evacuated to a vacuum. The inner electrode 22 and the outer electrode 23 are disposed in the quartz tube 21 and have rod shapes extending in the Y-direction. The inner electrode 22 has a circular cross-sectional shape and is disposed in a center part of the quartz tube 21. The outer electrode 23 has a fan-like cross-sectional shape and is disposed to surround the inner electrode 22 in an outer circumferential part inside the quartz tube 21. A central angle of this fan shape is, for example, 120 to 180 degrees. The inner electrode 22 and the outer electrode 23 have the same length.

The plasma generator 13 forms the plasma from the gas outside each plasma tube 13a, for example, by application of the microwave with 2.45 to 5.80 GHz and 500 to 2000 W between the inner electrode 22 and the outer electrode 23 in each plasma tube 13a.

Sign D designates a distance between the plasma tube 13a and the wafer 1. Specifically, sign D designates a distance between a lower end of the plasma tube 13a and an upper face of the wafer 1. The semiconductor manufacturing apparatus of the present embodiment can change the distance D by moving a position of the plasma tube 13a in an upward and downward direction as indicated by an arrow $A_3$. Moreover, the semiconductor manufacturing apparatus of the present embodiment can change the distance D by driving the supporting pins 12b as indicated by the arrow $A_1$ to move a position of the wafer 1 in the upward and downward direction. Control of the distance D is performed by the controller 17. Details of the control of the distance D are described later.

[Pre-Heater 14]

The pre-heater 14 includes at least one pre-heating tube 14a which is disposed below the supporter 12. The pre-heater 14 heats the wafer 1 on the backside of the wafer 1 with the pre-heating tube 14a.

The pre-heater 14 of the present embodiment heats the wafer 1 by irradiating the wafer 1 with the microwave generated from the pre-heating tube 14a. The frequency of the microwave may be any value. It should be noted that the desirable frequency of this microwave is configured similarly to the desirable frequency of the microwave generated by the plasma generator 13.

In the present embodiment, each pre-heating tube 14a has a shape extending in the Y-direction. The pre-heating tubes 14a are adjacent to one another in the X-direction. Distances between the pre-heating tubes 14a are set to be equal. The distance between the pre-heating tubes 14a is set to be shorter than the distance between the plasma tubes 13a for excellent in-plane uniformity of a pre-heating temperature of the wafer 1. An example of the distance between the pre-heating tubes 14a is 20 mm or less.

The pre-heating tube 14a may be a lamp-heating tube in place of the microwave-heating tube. It should be noted that the pre-heating tube 14a to be the microwave-heating tube has an advantage that a target region for heating of the wafer 1 can be efficiently heated, for example, in the case where the target region for heating is formed of a material having electronic polarization.

[Gas Feeding Apparatus 15]

The gas feeding apparatus 15 includes a gas feeder 15a, a gas shower head 15b and a gas introducing pipe 15c.

The gas feeder 15a feeds the processing gas for processing the wafer 1 and cooling gas for cooling the wafer 1. Examples of the processing gas are oxygen gas for forming the oxide film and nitrogen gas for forming the nitride film. Examples of the cooling gas are inert gases such as argon gas, neon gas, xenon gas and helium gas.

The gas shower head 15b is disposed above the supporter 12 in the chamber 11 and has a plurality of openings for introducing the gases as above into the chamber 11. The gas introducing pipe 15c connects the gas feeder 15a to the gas shower head 15b. The gas from the gas feeder 15a is introduced into the chamber 11 via the gas introducing pipe 15c and the gas shower head 15b.

[Temperature Measurement Module 16]

The temperature measurement module 16 includes a plurality of thermometers 16a and is disposed outside the chamber 11. The temperature measurement module 16 measures temperatures at a plurality of points of the wafer 1 using these thermometers 16a and outputs measurement results of the temperatures to the controller 17.

Each thermometer 16a of the present embodiment is a pyrometer and disposed in the vicinity of a window provided on a lower face of the chamber 11. The window is formed of a transparent member such as quartz and sapphire. Therefore, each thermometer 16a can measure the temperature of the wafer 1 by measuring an electromagnetic wave radiated from the backside of the wafer 1 via the window.

The temperature measurement module 16 of the present embodiment measures the temperature of a center part of the wafer 1, the temperature of an outer circumferential part of the wafer 1, and the temperature of a middle part between the center part and the outer circumferential part of the wafer 1 using three thermometers 16a. The semiconductor manufacturing apparatus of the present embodiment can realize the in-plane uniformity of the temperature of the wafer 1 by controlling these three temperatures to be the same temperature.

[Controller 17]

The controller 17 controls various kinds of operation of the semiconductor manufacturing apparatus of the present embodiment. For example, the controller 17 controls the operation of the supporter 12, the plasma generator 13, the pre-heater 14 and the gas feeding apparatus 15.

The controller 17 of the present embodiment changes the distance D between the plasma tube 13a and the wafer 1 during a period when the plasma generator 13 is forming the oxide film 1b on the wafer 1. Specifically, the controller 17 sets the distance D to be a first distance $D_1$ during a first period and sets the distance D to be a second distance $D_2$ longer than the first distance $D_1$ during a second period after the first period ($D_2 > D_1$). Namely, the controller 17 increases the distance D from the first distance $D_1$ to the second distance $D_2$ during the period when the plasma generator 13 is forming the oxide film 1b on the wafer 1. Such oxidation processing of the wafer 1 is described in detail with reference to FIGS. 2A to 2C.

(1) Oxidation Processing of First Embodiment

Figure 2A:
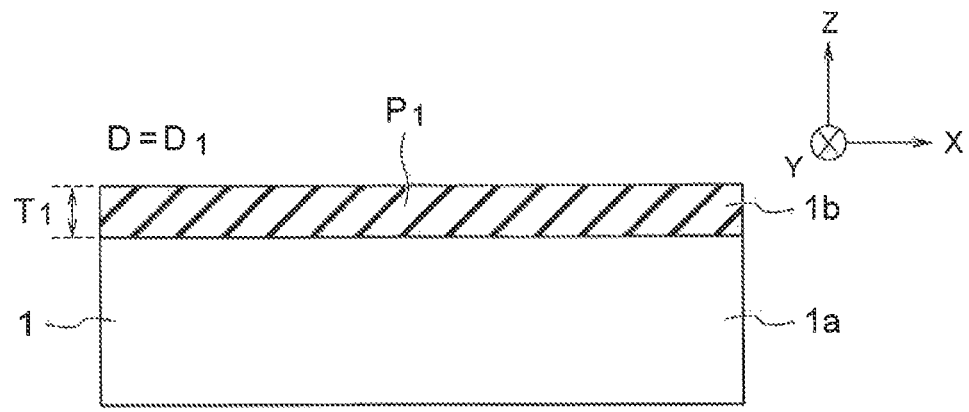
FIGS. 2A to 2C are cross-sectional views for explaining oxidation processing of a wafer of the first embodiment.
Figure 2B:
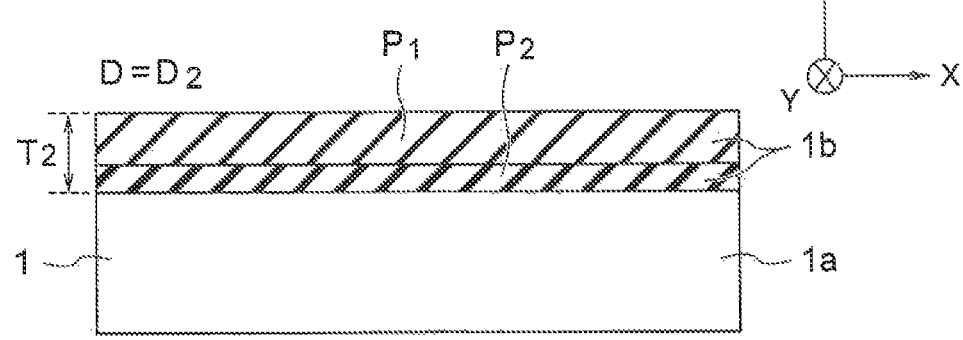
Figure 2C:
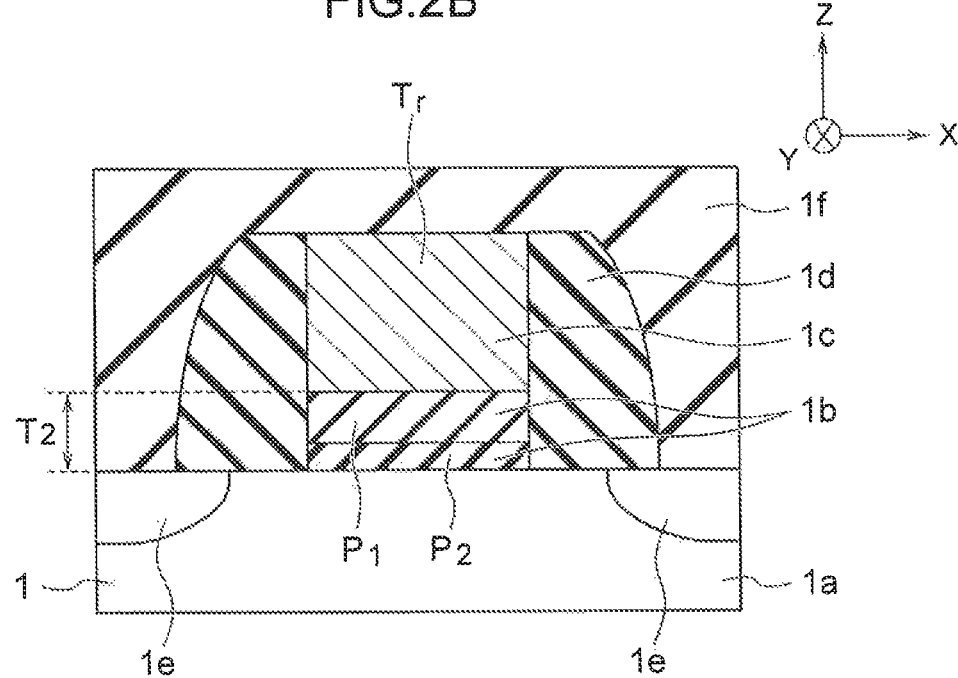

FIGS. 2A to 2C are cross-sectional views for explaining oxidation processing of the wafer 1 of the first embodiment.

First, the plasma is generated in the chamber 11 during the first period in the state where the distance D is set to be the first distance $D_1$. As a result, the oxide film 1b with a first thickness $T_1$ is formed on the surface of the semiconductor substrate 1a (FIG. 2A). Sign $P_1$ designates a first portion of the oxide film 1b formed during the first period.

Next, the distance D is increased from the first distance $D_1$ to the second distance $D_2$ between the first period and the second period. The plasma is then generated in the chamber 11 during the second period in the state where the distance D is set to be the second distance $D_2$. As a result, the thickness of the oxide film 1b is increased from the first thickness $T_1$ to a second thickness $T_2$ (FIG. 2B). Sign $P_2$ designates a second portion of the oxide film 1b formed during the second period. The second portion $P_2$ is formed below the first portion $P_1$.

The plasma generator 13 may suspend the generation of the plasma between the first period and the second period or may continue to generate the plasma between the first period and the second period.

The oxide film 1b is used, for example, as a gate insulator of a transistor Tr such as a MOSFET (FIG. 2C). A semiconductor device in FIG. 2C includes, as components of the transistor Tr, the semiconductor substrate 1a, the oxide film 1b on the semiconductor substrate 1a, a gate electrode 1c on the oxide film 1b, sidewall insulators 1d formed on lateral faces of the gate electrode 1c, and source/drain region 1e formed in the semiconductor substrate 1a to interpose the gate electrode 1c. The transistor Tr is covered with an inter layer dielectric 1f.

The first and second distances $D_1$ and $D_2$ will be described in detail.

In the present embodiment, in order to improve quality of the oxide film 1b, the wafer 1 is annealed after the first and second periods. In this stage, the quality of the oxide film 1b after the annealing is affected by the quality of the oxide film 1b at an interface between the semiconductor substrate 1a and the oxide film 1b before the annealing. Therefore, the oxidation processing during the second period is desirable to be performed such that the quality of the second portion $P_2$ is improved. Accordingly, during the second period of the present embodiment, the distance D is set to be a long distance (second distance $D_2$).

On the other hand, the quality of the oxide film 1b after the annealing is hardly affected by the quality of the other portion except the oxide film 1b before the annealing. Therefore, the oxidation processing during the first period is desirable to be performed such that the first portion $P_1$ is formed in a short time rather than that the quality of the first portion $P_1$ is improved. Accordingly, during the first period of the present embodiment, the distance D is set to be a short distance (first distance $D_1$).

Accordingly, the present embodiment makes it possible, by setting the distance D to be the first distance $D_1$ during the first period and setting the distance D to be the second distance $D_2$, during the second period, to form the oxide film 1b excellent in quality in a short time.

The quality of the oxide film 1b can be evaluated, for example, based on an interface state density of the oxide film 1b. According to the present embodiment, the interface state density of the second portion $P_2$ can be lower than the interface state density of the first portion $P_1$.

The first thickness $T_1$ indicates the thickness of the first portion $P_1$. A difference between the second thickness $T_2$ and the first thickness $T_1$ indicates the thickness of the second portion $P_2$. In the present embodiment, the thickness of the second portion $P_2$ is desirable to be thinner than the thickness of the first portion $P_1$. Namely, the difference between the second thickness $T_2$ and the first thickness $T_1$ is desirable to be smaller than the first thickness $T_1$ ($T_2 - T_1 < T_1$). The reason is that the thinner the thickness of the second portion $P_2$ is, in the shorter time the oxide film 1b can be formed, and that even when the thickness of the second portion $P_2$ is thin, the quality of the oxide film 1b after the annealing is improved. Transformation of expression "$T_2 - T_1 < T_1$" demonstrates that the second thickness $T_2$ is desirable to be smaller than twice of the first thickness $T_1$ ($T_2 < 2T_1$). Examples of the first and second thicknesses $T_1$ and $T_2$ of the present embodiment are 4 nm and 5 nm, respectively.

Moreover, examples of the first and second distances $D_1$ and $D_2$ of the present embodiment are 50 mm or less and 60 mm or more, respectively. In the present embodiment, the distance D can be changed by moving the position of the plasma tube 13a in the upward and downward direction as indicated by the arrow $A_3$. Moreover, in the present embodiment, the distance D can be changed by driving the supporting pins 12b as indicated by the arrow $A_1$ to move the position of the wafer 1 in the upward and downward direction.

It should be noted that, since the change of the distance D in the present embodiment is fine change of the distance of approximately 10 mm, there is a possibility that the distance D is difficult to be changed with the supporting pins 12b. Accordingly, when the distance D is changed with the supporting pins 12b, the supporting pins 12b is desirable to be driven, for example, based on the control of a goniometer and a pulse motor.

The temperature of the wafer 1 and a pressure of the processing gas will be described in detail.

The controller 17 controls the operation of the plasma generator 13 and the pre-heater 14 on the basis of the temperature of the wafer 1 received from the temperature measurement module 16. By doing so, the controller 17 can control the temperature of the wafer 1 to be a predetermined temperature. The controller 17 may control the temperature at a predetermined point of the wafer 1 to be the predetermined temperature on the basis of the temperature received from one thermometer 16a, or may control the temperatures at a plurality of points of the wafer 1 to be the predetermined temperature on the basis of the temperatures received from the plural thermometers 16a.

The controller 17 of the present embodiment controls the temperature of the wafer 1 during the first and second periods to be 250° C. or less. Therefore, according to the present embodiment, the oxide film 1b low in impurity can be formed with low damage. Moreover, in the case where the wafer 1 contains an organic film, when the temperature of the wafer 1 during the first and second periods is set to be 300° C. or more, the organic film possibly suffers damage. According to the present embodiment, the temperature of the wafer 1 during the first and second periods is set to be 250° C. or less, and thereby, the damage to the organic film can be suppressed.

Moreover, the controller 17 controls the pressure of the processing gas in the chamber 11 by controlling the operation of the gas feeding apparatus 15. The processing gas of the present embodiment is oxygen gas.

The controller 17 of the present embodiment controls the pressure of oxygen gas during the first and second periods to be 0.1 to 2.0 Torr. The reason is that if the pressure of oxygen gas is too high, it causes a radical-rich state in the chamber 11, not an ion-rich one. Moreover, if the pressure of oxygen gas is too low, it is liable to cause discharge in the chamber 11.

(2) Details of Oxidation Processing of First Embodiment

Details of the oxidation processing of the wafer 1 of the first embodiment are described with reference to FIGS. 3 to 6.

Figure 3:
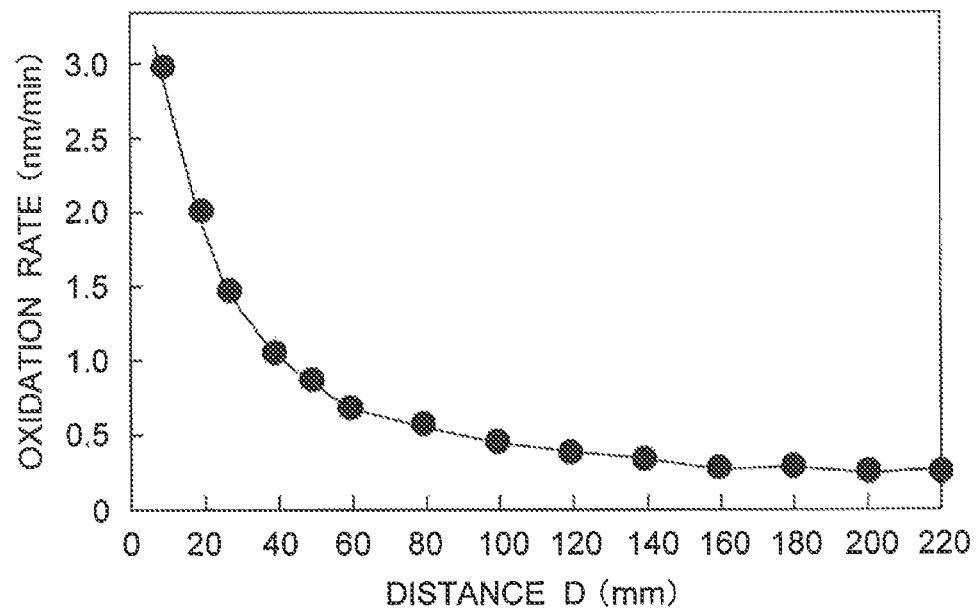
FIG. 3 is a graph illustrating relation between an oxidation rate of the wafer of the first embodiment and a distance D.

FIG. 3 is a graph illustrating relation between an oxidation rate of the wafer 1 of the first embodiment and the distance D.

FIG. 3 presents that the larger the distance D is, the slower the oxidation rate of the wafer 1 is. Therefore, the larger the distance D is, the longer time the formation of the oxide film 1b takes. The reason for the slower oxidation rate as the distance D is larger is that the density of the electrons 32 lowers as being more apart from the plasma tube 13a.

Figure 4:
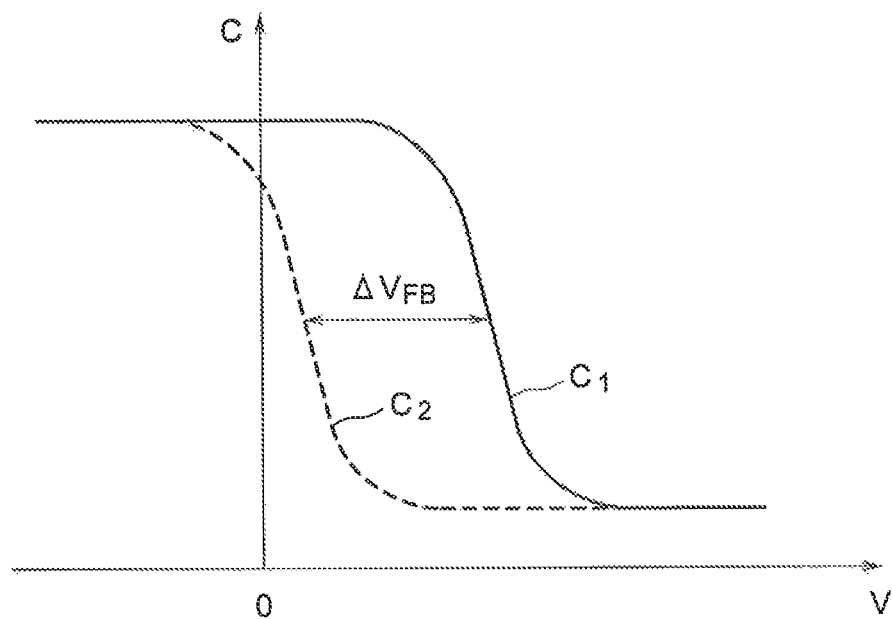
FIG. 4 is a graph illustrating characteristics of a transistor including an oxide film of the first embodiment.

FIG. 4 is a graph illustrating characteristics of the transistor Tr including the oxide film 1b of the first embodiment.

The horizontal axis in FIG. 4 indicates a voltage applied between the semiconductor substrate 1a and the gate electrode 1c of the transistor Tr, that is, a gate voltage of the transistor Tr. The vertical axis in FIG. 4 indicates an electrostatic capacity C between the semiconductor substrate 1a and the gate electrode 1c of the transistor Tr.

A curve $C_1$ indicates a C-V property of the transistor Tr in its design. A curve $C_2$ indicates the C-V property of the transistor Tr actually manufactured. Sign $\Delta V_{FB}$ designates a shift amount of a flat band voltage $V_{FB}$ of the transistor Tr. When the quality of the oxide film 1b of the transistor Tr is poor, the flat band voltage $V_{FB}$ is caused to be largely shifted as illustrated in FIG. 4.

Figure 5:
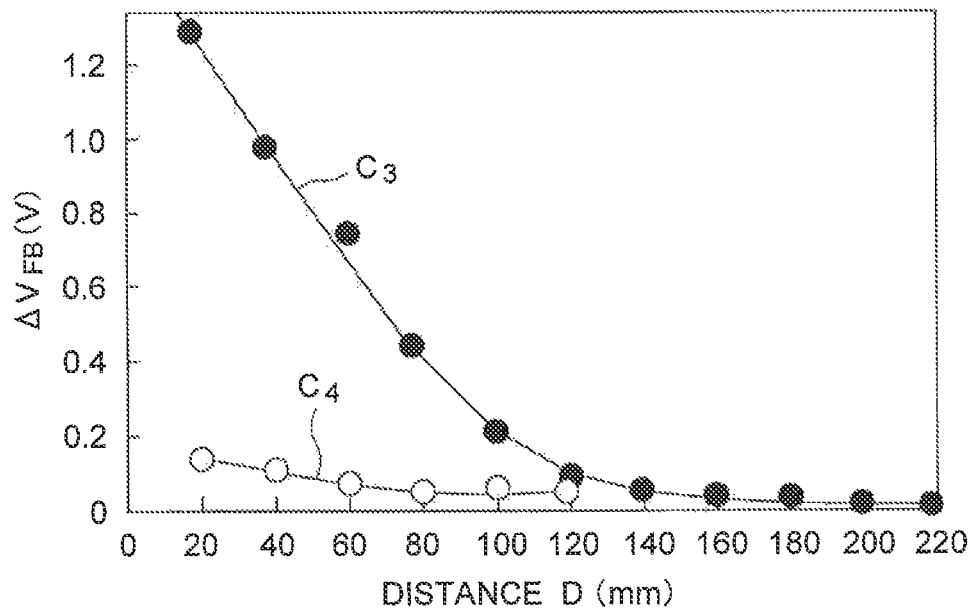
FIG. 5 is a graph illustrating a shift amount $\Delta V_{FB}$ of a flat band voltage $V_{FB}$ of the transistor including the oxide film of the first embodiment.

FIG. 5 is a graph illustrating the shift amount $\Delta V_{FB}$ of the flat band voltage $V_{FB}$ of the transistor Tr including the oxide film 1b of the first embodiment.

A curve $C_3$ indicates the characteristics of the transistor Tr in the case where the distances ID during the first and second periods are set to be the same distance. For the curve $C_3$, the horizontal axis in FIG. 5 indicates the distance D. A curve $C_4$ indicates the characteristics of the transistor Tr in the case of the distances D during the first and second periods are set to be the first and second distances $D_1$ and $D_2$, respectively. For the curve $C_4$, the horizontal axis in FIG. 5 indicates the first distance $D_1$. The second distance $D_2$ takes a value larger than 100 mm for the curve $C_4$.

From the curve $C_3$, the shift amount $\Delta V_{FB}$ is apparent to be large in the case where the distance D during the first and second periods is 100 mm or less. Moreover, from the curve $C_4$, the shift amount $\Delta V_{FB}$ is apparent to be small in the case where the second distance $D_2$ is larger than 100 mm even when the first distance $D_1$ is 100 mm or less.

In this manner, the present embodiment makes it possible, by setting the distance D to be the first distance $D_1$ during the first period and setting the distance D to be the second distance $D_2$ during the second period, to reduce the shift amount $\Delta V_{FB}$ of the flat band voltage $V_{FB}$.

Figure 6:
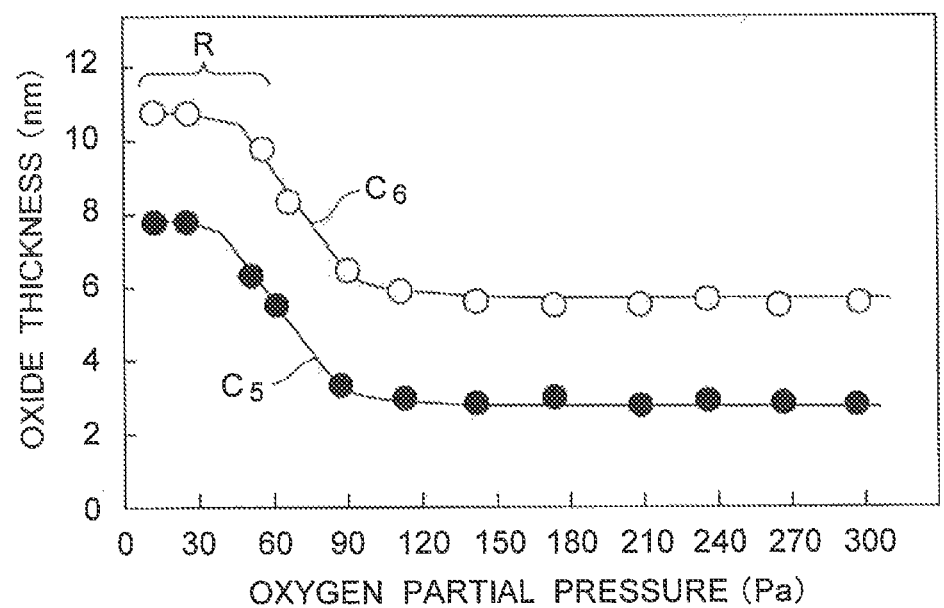
FIG. 6 is a graph illustrating relation between an oxide thickness of the wafer of the first embodiment and the distance D.

FIG. 6 is a graph illustrating relation between the oxide thickness of the wafer 1 of the first embodiment and the distance D.

The horizontal axis in FIG. 6 indicates a partial pressure of the processing gas (oxygen gas) in the chamber 11. The vertical axis in FIG. 6 indicates the thickness of the oxide film 1b. A curve $C_5$ indicates the oxide thickness in the case where the wafer 1 is pre-heated at 60° C. with the pre-heater 14 that uses the microwave. A curve $C_6$ indicates the oxide thickness in the case where the wafer 1 is pre-heated at 250° C. with the pre-heater 14 that uses the microwave. Oxidation time is 5 minutes for the curves $C_5$ and $C_6$. The curves $C_5$ and $C_6$ indicate the oxidation processing during the first period. Hence, the distance D is set to be the first distance $D_1$.

Sign R indicates a region in which the partial pressure of oxygen gas is 60 Pa or less. From FIG. 6, it is apparent that the oxidation rate during the first period is fast when the partial pressure of oxygen gas is set to be 60 Pa or less.

As described above, the apparatus of the present embodiment sets the distance D between the plasma tube 13a and the wafer 1 to be the first distance $D_1$ during the first period, and sets the distance D to be the second distance $D_2$ longer than the first distance $D_1$ during the second period after the first period. Accordingly, the present embodiment makes it possible to form the oxide film 1b excellent in quality with the plasma in a short time.

In the present embodiment, the period when the oxide film 1b is formed on the wafer 1 may be divided into first to Nth periods for which the distance D is set to be first to Nth distances $D_1$ to $D_N$, respectively (N is an integer not less than 2). In this case, in order to form the oxide film 1b excellent in quality in a short time, the Nth distance $D_N$ is desirable to be set to be longer than at least one of the first to (N−1)th distances $D_1$ to $D_{N-1}$ (for example, a Kth distance). In this case, the Kth distance $D_K$ and the Nth distance $D_N$ correspond to the examples of the first distance and the second distance of the disclosure, respectively.

Second Embodiment

Figure 7:
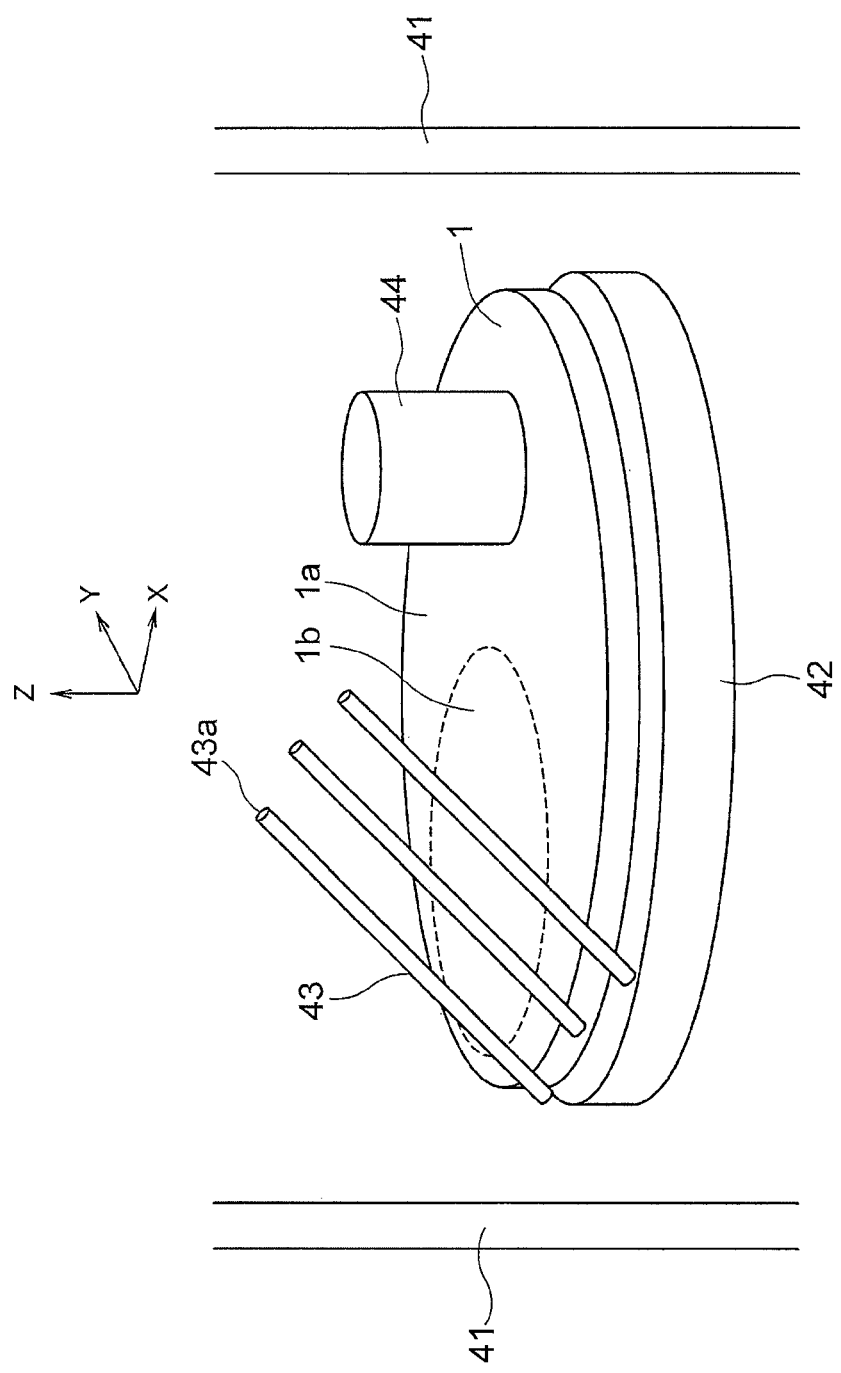
FIG. 7 is a cross-sectional view schematically illustrating a structure of a semiconductor manufacturing apparatus of a second embodiment.

FIG. 7 is a cross-sectional view schematically illustrating a structure of a semiconductor manufacturing apparatus of a second embodiment. Examples of the semiconductor manufacturing apparatus in FIG. 7 are a grinder apparatus and a chemical mechanical polishing (CMP) apparatus.

The semiconductor manufacturing apparatus in FIG. 7 includes a housing 41 as an example of the container, a supporter 42, a plasma generator 43 including at least one plasma tube 43a, and a planarization module 44.

The housing 41 is used for containing the wafer 1. The supporter 42 is used for supporting the wafer 1 in the housing 41. The plasma generator 43 and the plasma tube 43a have the similar structures of the plasma generator 13 and the plasma tube 13a in FIG. 1, respectively. The planarization module 44 is used for planarizing the surface of the wafer 1 in the housing 41. Examples of the planarization module 44 are a grinder and a CMP pad.

The semiconductor manufacturing apparatus in FIG. 7 further includes the pre-heater 14, the gas feeding apparatus 15, the temperature measurement module 16 and the controller 17, which are not shown, similarly to the semiconductor manufacturing apparatus in FIG. 1.

The wafer 1 includes the semiconductor substrate 1a and the oxide film 1b formed on the surface of the semiconductor substrate 1a. An example of the semiconductor substrate 1a is a silicon carbide (SiC) substrate. The semiconductor manufacturing apparatus of the present embodiment forms the oxide film 1b on the surface of the semiconductor substrate 1a before the surface of the semiconductor substrate 1a is planarized. A method of forming the oxide film 1b is same as in the case of the first embodiment. After that, the semiconductor manufacturing apparatus of the present embodiment planarizes the surface of the wafer 1 by grinding (or polishing) the oxide film 1b with the planarization module 44.

According to the present embodiment, a grinding rate (polishing rate) of the wafer 1 can be fast by planarizing the surface of the wafer 1 after the oxide film 1b is formed on the surface of the wafer 1. In an experiment, the grinding rate in the case of forming the oxide film 1b was 10 times or more faster than the grinding rate in the case of not forming the oxide film 1b.

In the case where the planarization module 44 of the present embodiment is the CMP pad, a surface of the planarization module 44 is sometimes damaged after usage of the planarization module 44. In this case, the damaged surface of the planarization module 44 may be treated with acid to form roughness on the surface of the planarization module 44.

Moreover, a method of planarizing the wafer 1 of the present embodiment may be performed using the semiconductor manufacturing apparatus of the first embodiment and a typical grinder apparatus or CMP apparatus. In this case, the oxide film 1b is formed by the semiconductor manufacturing apparatus of the first embodiment and the planarizing of the wafer 1 is performed by the typical grinder apparatus or CMP apparatus.

Modifications of First and Second Embodiments

Modifications of the first and second embodiments will be described.

The semiconductor substrate 1a of the first and second embodiments may be a Si substrate or a SiC substrate. Moreover, the semiconductor substrate 1a of the first and second embodiments may be a substrate on a surface of which a gallium nitride (GaN) layer or an aluminum gallium nitride (AlGaN) layer is formed. In these cases, the surface of the semiconductor substrate 1a may be planarized by setting the inside of the chamber 11 or the housing 41 to a reduced hydrogen atmosphere and generating hydrogen radicals in the chamber 11 or the housing 41 with the plasma generator 13, 43.

Moreover, the semiconductor manufacturing apparatuses of the first and second embodiments may be used for oxidation of the surface of a nitride film on the wafer 1 and/or nitriding of the surface of the oxide film on the wafer 1. In the case of the latter, the surface of the oxide film may be nitrided by setting the inside of the chamber 11 or the housing 41 to a reduced nitrogen atmosphere and generating nitrogen radicals in the chamber 11 or the housing 41 with the plasma generator 13 or 43. The thickness of the nitride film formed on the surface of the oxide film is exemplarily 0.5 to 2.0 nm.

Moreover, in the first embodiment, an oxidation method in which the distance D between the plasma tube 13a and the wafer 1 is set to be the first distance $D_1$ during the first period and the distance D is set to be the second distance $D_2$ shorter than the first distance $D_1$ during the second period after the first period may be performed ($D_2<D_1$). This oxidation method can be used, for example, in the case where the oxide film 1b excellent in quality is formed during the first period and the oxide film 1b is used as a barrier film for preventing soft X-rays generated from the plasma from intruding into the semiconductor substrate 1a. After that, in this oxidation method, the distance D is reduced form the first distance $D_1$ to the second distance $D_2$. Thereby, while defects in the semiconductor substrate 1a caused by the soft X-rays are suppressed from occurring, the thickness of the oxide film 1b can be increased in a short time. This oxidation method can also be applied to the second embodiment.

In this oxidation method, the period when the oxide film 1b is formed on the wafer 1 may be divided into first to Nth periods for which the distance D is set to be first to Nth distances $D_1$ to $D_N$, respectively. For example, the period may be divided into first to third periods and the second distance $D_2$ may be set to be shorter than the first distance $D_1$ and the third distance $D_3$ ($D_2<D_1$, $D_3$). In this case, the oxide film 1b can be used as the barrier film of the configuration: $D_2<D_1$. The oxide film 1b excellent in quality can be formed in a short time of the configuration: $D_2<D_3$. In this case, the first distance $D_1$ and the second distance $D_2$ correspond to the examples of the first distance and the second distance of the disclosure, respectively. Furthermore, the second distance $D_2$ and the third distance $D_3$ correspond to the examples of the first distance and the second distance of the disclosure, respectively.

As described above, the first and second embodiments make it possible, by setting the distance D to be the first distance $D_1$ during the first period and setting the distance D to be the second distance $D_2$ different from the first distance $D_1$ during the second period, to form the oxide film 1b having desired characteristics with the plasma in a short time.

While certain embodiments have been described, these embodiments have been presented by way of example only, and are not intended to limit the scope of the inventions. Indeed, the novel apparatuses and methods described herein may be embodied in a variety of other forms; furthermore, various omissions, substitutions and changes in the form of the apparatuses and methods described herein may be made without departing from the spirit of the inventions. The accompanying claims and their equivalents are intended to cover such forms or modifications as would fall within the scope and spirit of the inventions.

The invention claimed is:
1. A semiconductor manufacturing apparatus comprising:
   a container configured to contain a wafer;
   a supporter configured to support and rotate the wafer in the container;
   a plasma generator including plasma tubes that extend in a first direction parallel with an upper face of the wafer supported by the supporter and are adjacent with each other in a second direction perpendicular to the first direction, and configured to form a film on the wafer by generating plasma in the container with the plasma tubes during a first period and during a second period after the first period;

a controller configured to set a distance between the plasma tubes and the wafer to be a first distance during the first period, and set the distance to be a second distance longer than the first distance during the second period;

a heater provided on an opposite side to the plasma generator in relation to the supporter, provided outside the supporter, and configured to heat the wafer; and a gas feeding apparatus including an opening above the supporter in the container, and configured to introduce a gas from the opening into the container, wherein the plasma generator is provided between the opening and the supporter.

2. The apparatus of claim 1, wherein the plasma generator generates the plasma by generating a microwave in the plasma tubes.

3. The apparatus of claim 2, wherein a frequency of the microwave is 2.0 to 30.0 GHz.

4. The apparatus of claim 1, wherein the heater heats the wafer by irradiating the wafer with a microwave.

5. The apparatus of claim 1, wherein the controller controls the distance by moving a position of the plasma tubes.

6. The apparatus of claim 1, wherein the controller controls the distance by driving the supporter to move a position of the wafer.

7. The apparatus of claim 1, wherein the controller controls a temperature of the wafer during the first and second periods to be 250° C. or less.

8. The apparatus of claim 1, further comprising a planarization module configured to planarize a surface of the wafer in the container.

9. A semiconductor manufacturing apparatus comprising:
a container configured to contain a wafer;
a supporter configured to support and rotate the wafer in the container;
a plasma generator including plasma tubes that extend in a first direction parallel with an upper face of the wafer supported by the supporter and are adjacent with each other in a second direction perpendicular to the first direction, and configured to form a film on the wafer by generating plasma in the container with the plasma tubes during a first period and during a second period after the first period;
a controller configured to set a distance between the plasma tubes and the wafer to be a first distance during the first period, and set the distance to be a second distance shorter than the first distance during the second period;
a heater provided on an opposite side to the plasma generator in relation to the supporter, provided outside the supporter, and configured to heat the wafer; and
a gas feeding apparatus including an opening above the supporter in the container, and configured to introduce a gas from the opening into the container,
wherein the plasma generator is provided between the opening and the supporter.

10. The apparatus of claim 9, wherein the plasma generator generates the plasma by generating a microwave in the plasma tubes.

11. The apparatus of claim 9, wherein the controller controls the distance by moving a position of the plasma tubes.

12. The apparatus of claim 9, wherein the controller controls the distance by driving the supporter to move a position of the wafer.

* * * * *